United States Patent [19]

Haafkens et al.

[11] Patent Number: 5,403,401
[45] Date of Patent: Apr. 4, 1995

[54] SUBSTRATE CARRIER

[75] Inventors: Maarten H. Haafkens, Deurne; Marinus O. Sielcken, Eindhoven, both of Netherlands

[73] Assignee: Xycarb B.V., Netherlands

[21] Appl. No.: 205,685

[22] Filed: Mar. 2, 1994

[30] Foreign Application Priority Data

Mar. 4, 1993 [NL] Netherlands .................. 9300389

[51] Int. Cl.$^6$ .............................................. B32B 9/00
[52] U.S. Cl. ................... 118/728; 118/500; 118/729; 118/730; 118/731; 428/408
[58] Field of Search .................. 118/728, 730, 500

[56] References Cited

U.S. PATENT DOCUMENTS

| | | | |
|---|---|---|---|
| 4,397,901 | 8/1983 | Warren | 428/101 |
| 4,424,096 | 1/1984 | Kumagai | 156/643 |
| 4,486,473 | 12/1984 | Kahe | 427/249 |
| 4,499,354 | 2/1985 | Hill | 219/10.49 R |
| 4,710,428 | 12/1987 | Tamamizu | 428/408 |
| 4,780,174 | 10/1988 | Lan | 156/610 |
| 4,907,534 | 3/1990 | Huang | 118/725 |
| 5,033,538 | 7/1991 | Wagner | 165/80.1 |

FOREIGN PATENT DOCUMENTS 3942931   6/1990   Germany .................. 118/728

*Primary Examiner*—R. Bruce Breneman
*Assistant Examiner*—Jeffrie R. Lund
*Attorney, Agent, or Firm*—Skjerven, Morrill, MacPherson, Franklin & Friel

[57] ABSTRACT

A flat substrate carrier comprising a machined main surface for supporting substrates to be treated, a surface opposite to the main surface and coating on all sides. The main surface may have been machined with a view to the removal of the treated substrates from the main surface following treatment. The opposite surface has been subjected to such a machining operation or treatment that the mechanical stresses at both surfaces substantially compensate each other. The opposite surface may be machined over substantially the same area as the main surface, for example by using a material-removing operation or an EDM-operation. Both surfaces may have been subjected to the same operation. In case a treatment is carried out, which treatment may be a physical or a chemical treatment, just like the treatment by which the coating is applied, the thickness of the coating at the opposite surface may be less than the maximum thickness of the coating at the main surface. The substrate carrier itself may comprise graphite, carbon, ceramics, metal or a metal alloy, whilst the coating may comprise silicon carbide, pyrolytic graphite, aluminium nitride, aluminium oxide or silicon nitride. The thickness of the coating may range from 1–1,000 μm. The advantage of the proposed substrate carrier is that it will not warp after the coating has been applied.

12 Claims, 2 Drawing Sheets

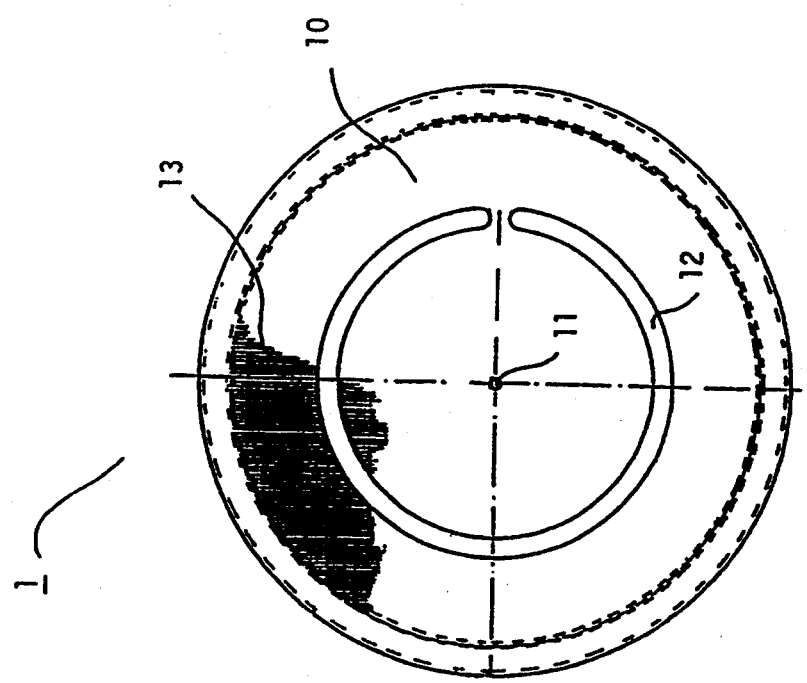
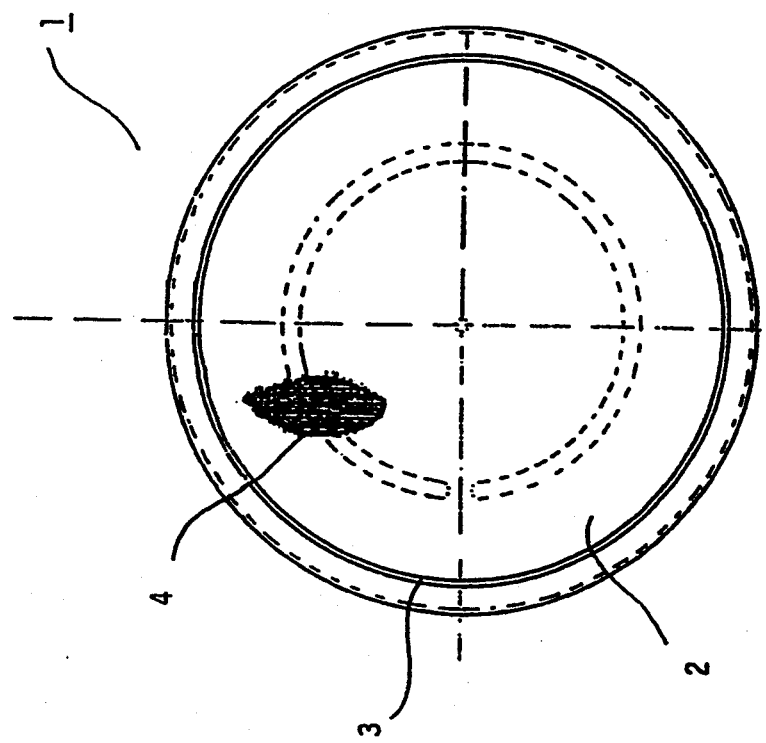

SUBSTRATE CARRIER

FIELD OF THE INVENTION

The invention relates to a flat substrate carrier comprising a machined main surface for supporting substrates to be treated and a coating on all sides.

BACKGROUND OF THE INVENTION

Such a substrate carrier may be considered to be known from U.S. Pat. No. 4,821,674.

The known substrate carrier in the shape of a so-called susceptor for supporting a single substrate for rotation about an axis extending perpendicularly to the centre of the substrate, which is intended for use in a chemical vapour deposition chamber of the type which is used for manufacturing integrated circuits has been machined with a view to the removal of the treated substrates from the main surface following treatment and has the undesirable characteristic of warping after the coating has been applied.

The object of the invention is to provide a flat substrate carrier which will remain flat also after the coating has been applied.

SUMMARY OF THE INVENTION

In order to accomplish that objective the invention provides a substrate carrier of the kind mentioned in the introduction, which is characterized in that the surface of the substrate carrier opposite to the main surface has been subjected to such a machining operation or treatment that the mechanical stresses at the two surfaces substantially compensate each other.

The main surface may be machined for another reason than the one mentioned above, for example in order to ensure an optimum temperature distribution of the substrate carrier in the chemical vapour deposition chamber.

The proposed treatment may consist of applying respective coatings on the said two surfaces in varying thicknesses.

BRIEF DESCRIPTION OF THE DRAWINGS

The invention will be discussed in more detail hereafter with reference to the drawings, in which:

FIG. 1 is a plan view of an embodiment of the proposed substrate carrier;

FIG. 2 is a bottom view of the substrate carrier of FIG. 1; and

DETAILED DESCRIPTION OF THE PREFERRED EMBODIMENTS

Figure 3:
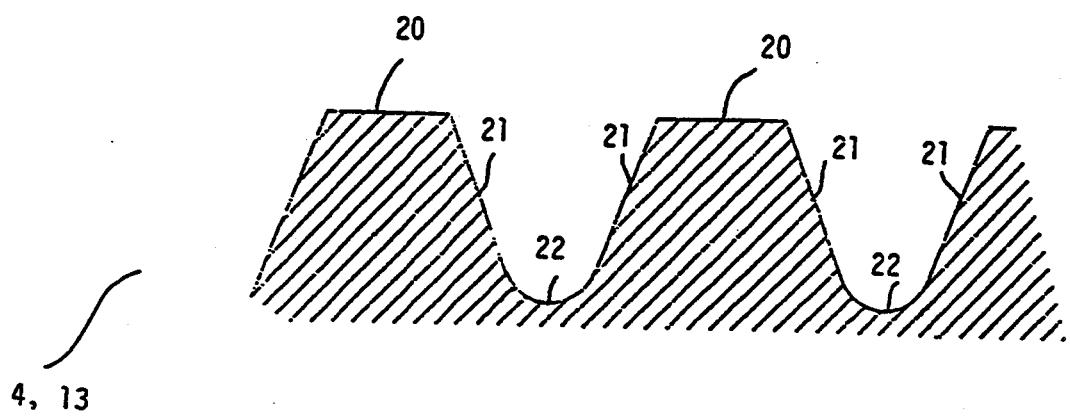
FIG. 3 is a larger-scale view of a possible groove profile of the proposed substrate carrier.

As shown in FIG. 1 the proposed substrate carrier does not necessarily differ from a known substrate carrier when seen in plan view. In FIG. 1 the substrate carrier, in this case in the shape of a rotatable circular flat single-substrate carrier or single wafer susceptor, is indicated by reference numeral 1 and its main surface is indicated by reference numeral 2. The substrate carrier 1 may consist of a material based on graphite, carbon, ceramics, metal or a metal alloy, and is on all sides provided with a coating of for example silicon carbide, pyrolytic graphite, aluminium nitride, aluminium oxide or silicon nitride, which coating may have been applied by means of a chemical vapour deposition process. The main surface 2 is provided with a circular upright edge 3, within which a wafer (not shown) may be accommodated. From a technical point of view, however, it is possible to leave out said edge 3. The main surface 2 of the substrate carrier 1 has been machined, within the edge 3 in this case, and a small portion of said machined surface is schematically illustrated and indicated by reference numeral 4.

FIG. 2 shows the substrate carrier 1 in bottom view. Reference numeral 10 indicates the surface of the substrate carrier 1 opposite the main surface 2 (FIG. 1), whilst reference numeral 11 indicates a central blind hole and reference numeral 12 indicates a substantially circular slot with closed ends, which functions to support and drive the substrate carrier in a chemical vapour deposition chamber. Up to this point the bottom view of FIG. 2 might also be that of a known susceptor.

It is noted that it is not necessary for the substrate carrier 1 according to the invention to be circular or rotatable, nor does it have to be arranged for carrying a single substrate, although these characteristics do reflect what is common practice at this moment. A flat substrate carrier having a rectangular shape and being suitable for supporting several substrates, which is not rotatable, is for example anticipated. Furthermore it is anticipated that the substrate carrier according to the invention may be used with other processes besides CVD-processes, for example with a different vapour deposition process, such as a PVD-process.

Returning to FIG. 1, the substrate carrier 1 is provided with a machined profile 4 at its main surface 2, for example because a substrate would stick to the main surface 2 of the substrate carrier 1, for example following the epitaxial growth of doped silicon, if such a profile 4 were not provided, which would seriously interfere with the automatic removal of the substrate, a semiconductor wafer.

Generally the proposed substrate carrier 1 is a flat substrate carrier 1 being provided with a coating on all sides and having a main surface 2 for supporting substrates to be treated, which main surface has been machined (4) with a view to the removal of the treated substrates from the main surface 2 following treatment. In accordance with the invention, and as indicated at 13 in FIG. 2, the surface 10 (FIG. 2) opposite the main surface 2 (FIG. 1) of the substrate carrier 1 has been machined in such a manner, that the mechanical stresses at the two surfaces 2, 10 substantially compensate each other, as a result of which there will be no significant warping of the substrate carrier 1 after the coating has been applied.

As is presently assumed the aforesaid mechanical stresses are determined by differences in the coefficient of thermal expansion and in the thickness of the coating on machined surfaces, as well as by internal stresses in the coating, possibly resulting from dislocations.

In accordance with the present invention, but not shown in the drawings, the surface 10 (FIG. 2) opposite the main surface 2 (FIG. 1) of the substrate carrier 1 may be treated in such a manner that the mechanical stresses at the two surfaces 2, 10 substantially compensate each other, so that substantially no warping will occur, whereby said treatment may for example consist of using different thicknesses for the coatings on the opposite surface 10 and the main surface 2.

In case a machining operation is carried out the opposite surface 10 (FIG. 2) is preferably machined over substantially the same area as the main surface (FIG. 1).

Furthermore it is preferred to machine the opposite surface 10 (FIG. 2) in the same manner as the main surface 2 (FIG. 1). Said machining operation may thereby consist of providing a pattern of grooves 4 (FIG. 1) and 13 (FIG. 2), as is indicated in more detail in FIG. 3. Of course other profiles are also possible and a person skilled in the art will know in what manner such profiles may be provided in the substrate carrier, for example by using a material-removing operation or an EDM-operation, after which the substrate carrier will be coated on all sides, for example with a refractory layer.

In case a treatment is carried out, which treatment may be a physical or a chemical coating, the treatment will be such that the thickness of the resulting coating at the opposite surface (FIG. 2), in case no machining profile 13 is present, will be less than the maximum coating thickness at the main surface, since the coating formed at the opposite surface 10 (FIG. 2) will have a uniform thickness, because no groove pattern 13 is present at that surface, whilst the coating present on the machining pattern 4 (FIG. 1) will be such that the thickness of the coating on the peaks 20 of the profile 4 will be greater than on the slopes 21 and in the valleys 22 thereof, whereby reference is again made to FIG. 3, so that said latter thickness is effectively smaller.

The thickness of the coating may range from 1–1,000 $\mu$m. With a prototype in the shape of a graphite substrate carrier 1 having a diameter of $\pm 200$ mm and a thickness of 9 mm within the edge 3 and being provided with a coating of about 100 micron of CVD-silicon carbide on all sides, the main surface 2 according to FIGS. 1 and 2 appeared to exhibit a concavity of 0.8 mm at that location when machining was carried out on one side (4), whilst said concavity appeared to have been reduced to 0.05 mm when machining was carried out on both sides (4, 13) in accordance with FIGS. 1–3.

Similar results were obtained when instead of this the thickness of the coating on the now unmachined opposite side 10 (FIG. 2) was reduced. Methods for applying a coating of reduced thickness at the surface 10 opposite the main surface 2 are known to those skilled in the art.

In summary the invention provides two methods based on the same principle, which, when used individually or in combination with each other, result in a flat, thin substrate carrier. The one method consists of subjecting the bottom side of the substrate carrier to the same machining operation as the upper side of the substrate carrier, and the second method consists of using different thicknesses for the coatings on said two sides. Both methods provide mechanical stresses which compensate each other, thus ensuring that the substrate carrier remains flat.

We claim:

1. A flat substrate carrier comprising a machined main surface for supporting substrates to be treated and a coating on all sides, characterized in that the surface of the substrate carrier opposite to the main surface has been subjected to such a machining operation or treatment that the mechanical stresses at the two surfaces substantially compensate each other.

2. A substrate carrier according to claim 1, characterized in that said opposite surface is machined over substantially the same area as the main surface.

3. A substrate carrier according to claim 1, characterized in that said opposite surface has been subjected to the same machining operation as the main surface.

4. A substrate carrier according to claim 1, characterized in that the thickness of the coating at said opposite surface is less than the maximum coating thickness at the main surface.

5. A substrate carrier according to claim 1, characterized in that said substrate carrier comprises graphite, carbon, ceramics, metal or a metal alloy.

6. A substrate carrier according to claim 1, characterized in that said coating comprises silicon carbide, pyrolytic graphite, aluminium nitride, aluminium oxide or silicon nitride.

7. A substrate carrier according to claim 1, characterized in that the thickness of said coating ranges from 1–1,000 $\mu$m.

8. A substrate carrier according to claim 2, characterized in that the thickness of said coating ranges from 1–1,000 $\mu$m.

9. A substrate carrier according to claim 3, characterized in that the thickness of said coating ranges from 1–1,000 $\mu$m.

10. A substrate carrier according to claim 4, characterized in that the thickness of said coating ranges from 1–1,000 $\mu$m.

11. A substrate carrier according to claim 5, characterized in that the thickness of said coating ranges from 1–1,000 $\mu$m.

12. A substrate carrier according to claim 6, characterized in that the thickness of said coating ranges from 1–1,000 $\mu$m.

* * * * *